US012733145B2

(12) United States Patent
Justinger et al.

(10) Patent No.: US 12,733,145 B2
(45) Date of Patent: Sep. 8, 2026

(54) METHOD FOR DELIVERING COMPONENTS IN FEEDER CASSETTES, DELIVERY SYSTEM, COMPUTER PROGRAM PRODUCT AND COMPUTER-READABLE MEDIUM

(71) Applicant: ASMPT GmbH & Co. KG, Munich (DE)

(72) Inventors: Johannes Justinger, Landsberg am Lech (DE); Matthias Miksch, Munich (DE); Vincent Pfeifer, Munich (DE)

(73) Assignee: ASMPT GmbH & Co. KG (DE)

( * ) Notice: Subject to any disclaimer, the term of this patent is extended or adjusted under 35 U.S.C. 154(b) by 667 days.

(21) Appl. No.: 18/136,584

(22) Filed: Apr. 19, 2023

(65) Prior Publication Data

US 2023/0363130 A1 Nov. 9, 2023

(30) Foreign Application Priority Data

May 6, 2022 (DE) ..................... 10 2022 111 380.9

(51) Int. Cl.
*H05K 13/08* (2006.01)
*H05K 13/02* (2006.01)

(52) U.S. Cl.
CPC ......... *H05K 13/086* (2018.08); *H05K 13/021* (2013.01)

(58) Field of Classification Search
CPC ............... H05K 13/086; H05K 13/021; H05K 13/0419; H05K 13/046; H05K 13/0895
See application file for complete search history.

(56) References Cited

U.S. PATENT DOCUMENTS

| | | | | |
|---|---|---|---|---|
| 10,394,228 | B2 * | 8/2019 | Ohashi | H05K 13/0408 |
| 2008/0217394 | A1 * | 9/2008 | Okada | H05K 13/086 235/375 |
| 2017/0208713 | A1 * | 7/2017 | Iisaka | H05K 13/086 |
| 2021/0168978 | A1 | 6/2021 | Kawai | |

FOREIGN PATENT DOCUMENTS

| | | |
|---|---|---|
| JP | 2017-050473 A | 3/2017 |
| JP | 2018-160703 A | 10/2018 |

* cited by examiner

*Primary Examiner* — Justin Holmes
(74) *Attorney, Agent, or Firm* — OSTROLENK FABER LLP

(57) ABSTRACT

A method for delivering components in feeder cassettes to at least one placement device by a delivery system, the method includes the following method steps:

Figure 1:
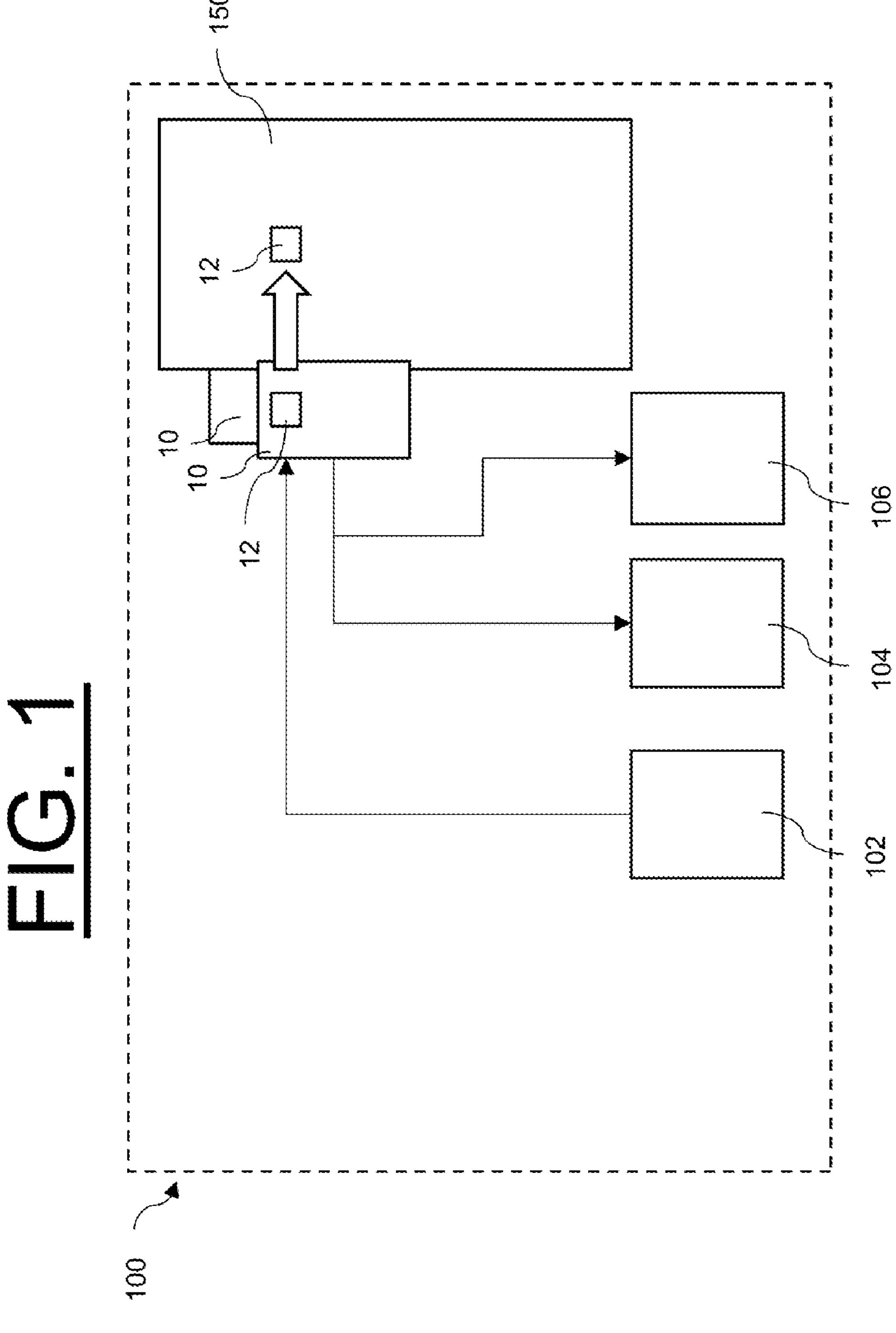

Detection of a mandatory exchange period (t1) for each of the feeder cassettes by the delivery system, Comparison of the recorded mandatory exchange periods (t1), wherein time conflicts (K) between the recorded mandatory exchange periods (t1) are determined by the delivery system during the comparison, Determination of an optional exchange period (t2) for at least one of the feeder cassettes with a determined time conflict (K) by the delivery system, Delivery of components in feeder cassettes to the at least one placement device within the at least one optional exchange period (t2) by the delivery system.

11 Claims, 4 Drawing Sheets

150
12
10
10
12
106
104
102
100

METHOD FOR DELIVERING COMPONENTS IN FEEDER CASSETTES, DELIVERY SYSTEM, COMPUTER PROGRAM PRODUCT AND COMPUTER-READABLE MEDIUM

CROSS-REFERENCE TO RELATED APPLICATIONS

The present application claims priority to German Patent Application No. 10 2022 111 380.9, filed May 6, 2022, the contents of which are incorporated herein by reference.

The present invention relates to a method for delivering components in feeder cassettes to at least one placement device using a delivery system. Furthermore, the invention relates to a delivery system for delivering feeder cassettes to at least one placement device. The invention also relates to a computer program product for delivering feeder cassettes to at least one placement device by the delivery system and a computer-readable medium on which the computer program product is stored.

The currently publicly known delivery processes for components, in particular SMT components for the assembly of printed circuit boards, comprise extensive manual work steps by personnel. In the known state of the art, the components are usually delivered rolled up on a spool using component belts. The component belts are usually moved forward by means of feeders and the components are thus delivered for the placement device. The spools have hitherto mostly been designed separately from the respective feeder, with a front free end of the component spool usually being inserted manually into the feeder. In the case of a spool change or the transition between two spools, the front free end of a new component spool is usually connected to the rear free end of the previous component spool in order to enable continuous delivery of components to the placement device. There are solution variants in which component spools are designed as part of the feeder, for example within a feeder cassette. In the embodiment as feeder cassettes, there is a need to exchange the feeder cassette, preferably after the last component of the respective feeder cassette has been picked up. The exchange of the feeder cassette is advantageously completed before the planned pick-up of a next component of the same type, in order to enable smooth operation of the placement device. A disadvantage of known delivery systems, however, is that when there are a large number of feeder cassettes, there are overlapping exchange periods for the feeder cassettes, with the result that trouble-free operation of the placement device is disrupted.

It is therefore the object of the present invention to eliminate or at least partially eliminate the disadvantages in the prior art described above. In particular, the object of the invention is to provide a method for delivering components in feeder cassettes to at least one placement device using a delivery system that makes it particularly easy to deliver components, and time delays for the operation of the at least one placement device due to the delivery of the feeder cassettes are advantageously avoided or at least reduced. In particular, it is also the object of the invention to provide a delivery system for delivering feeder cassettes to at least one placement device, a computer program product for delivering feeder cassettes to at least one placement device by the delivery system and a computer-readable medium on which the computer program product is stored.

The object set out above is achieved by the claims. In particular, the object is achieved by a method having the features of independent claim 1. Furthermore, the object is achieved by a delivery system having the features of independent claim 9, by a computer program product having the features of independent claim 10 and by a computer-readable medium having the features of independent claim 11. Further advantages and details of the invention emerge from the dependent claims, the description and the drawings. Features and details that are described in connection with the method according to the invention naturally also apply in connection with the delivery system according to the invention, the computer program product according to the invention, the computer-readable medium according to the invention and vice versa in each case, such that reciprocal reference is or can always be made with respect to the disclosure of individual aspects of the invention.

According to a first aspect of the invention, the object is achieved by a method for delivering components in feeder cassettes to at least one placement device using a delivery system. The method comprises the following method steps:

- Recording of a mandatory exchange period for each of the feeder cassettes by the delivery system,
- Comparing the recorded mandatory exchange periods, wherein time conflicts between the recorded mandatory exchange periods of the respective feeder cassettes are determined by the delivery system during the comparison,
- Determining an optional exchange period for at least one of the feeder cassettes with a determined time conflict by the delivery system,
- Delivering components in feeder cassettes to the at least one placement device in the at least one optional exchange period by the delivery system.

Unless explicitly stated otherwise, the method steps described above and below can be carried out individually, together, once, multiple times, at the same time and/or one after the other in any order. A designation as, for example, "first procedural step" and "second procedural step" does not require any chronological order and/or prioritization. A preferred order of the method steps provides that the method steps are carried out in the order listed.

The method according to the invention advantageously enables the smoothest possible delivery of components in feeder cassettes to the at least one placement device. In other words, the method according to the invention enables the advantageous delivery of feeder cassettes with components to the at least one placement device. The delivery system according to the invention is preferably designed to supply a large number of placement devices. The method according to the invention advantageously avoids or at least reduces the waiting time of a placement device for a process of delivering a feeder cassette.

Within the scope of the invention, a delivery system is preferably to be understood as a system of moving devices which are designed for moving, arranging, removing and/or inserting feeder cassettes. For example, the movement devices are designed as rail-guided movement devices. For example, the moving devices comprise gripping devices for interacting with, picking up and/or releasing the feeder cassettes. Within the scope of the invention, the delivery system enables the feeder cassettes to be picked up, for example from a storage position and/or a preparation device, and subsequently a delivery of the feeder cassettes for the at least one placement device.

Within the scope of the invention, the recorded mandatory exchange periods are to be understood as a period that begins after the last component of a feeder cassette has been removed. The components are removed from the feeder cassette by one of the placement devices, for example at constant or irregular intervals, and then placed on a circuit board and/or a substrate. In order to avoid or minimize a delay in the operation of the placement device, a new feeder cassette with the same components as were originally in the empty feeder cassette must be delivered, in particular before the placement device is ready to pick up the next component from the newly delivered feeder cassette. A mandatory exchange period is clearly described as a consumption and/or usage rate of the components of a feeder cassette and an initial number of components in the feeder cassette. The mandatory exchange periods for each of the feeder cassettes can thus be advantageously recorded. In practice, however, deviations from such plans occur, for example due to defective components that cannot be used. It is therefore advantageous if the method steps according to the invention are carried out iteratively, repeatedly, continuously and/or permanently by the delivery system.

In the case of placement devices, it is common in practice for a large number of components to be used with a corresponding number of feeder cassettes. In the comparison method step, the plurality of mandatory exchange periods are compared with one another. In the method comparison step, the recorded mandatory exchange periods are compared and timing conflicts are determined in the process. Timing conflicts are, for example, at least two mandatory exchange periods that are too close together in time to allow the at least two new feeder cassettes or at least two exchange feeder cassettes to be delivered without a delay for the placement device. As is clearly described, a time conflict arises when the mandatory exchange periods between two feeder cassettes that must be exchanged are less than a minute apart, for example. The necessary time interval between two mandatory exchange periods is of course dependent on the performance of the delivery system and therefore is not/should not be understood as being absolutely restrictive for the method according to the invention.

In the determination method step, an optional exchange period is determined for at least one, in particular for each, of the feeder cassettes that have a determined time conflict. The optional exchange period of a feeder cassette is earlier than the mandatory exchange period. An optional exchange period thus represents a period for an exchange of the feeder cassette in which not all components of the feeder cassette have been removed. An optional exchange period for at least one of the feeder cassettes affected by a determined time conflict by the delivery system advantageously enables an alternative exchange period to the mandatory exchange periods and thus an opportunity to avoid the time conflict. Preferably, as few optional exchange periods as possible are specified in order to resolve the time conflicts. Since every exchange of a feeder cassette in an optional exchange period means that components remain within the exchanged feeder cassette, an exchange in the respective mandatory exchange period is generally to be preferred within the scope of the invention. However, delivering a feeder cassette in the at least one optional exchange period advantageously enables at least one determined time conflict to be avoided. Defining an optional period of time as a delimitation of a point in time preferably allows the method and the delivery system to be flexible. For example, it is advantageously possible for the optional period of time to be defined with a time buffer and for the delivery system to decide itself when the feeder cassette is delivered within the optional period. This decision-making process preferably takes place according to at least one criterion described below.

According to the invention, components in feeder cassettes are delivered to the at least one placement device by the delivery system, as a minimum in the at least one optional exchange period. Furthermore, it is advantageous if at least a portion of the feeder cassettes delivered is made available within the respective mandatory exchange periods.

In the delivery method step, components in feeder cassettes are delivered by the delivery system to the at least one placement device in and/or before the at least one optional exchange period. Delivery is to be understood within the scope of the invention as a separate method step before the exchange of a feeder cassette, which is described in later sections. Delivery is to be understood in such a way that feeder cassettes filled with components, in particular completely filled, are delivered, with the respective feeder cassettes comprising the same components as the feeder cassettes to be exchanged and/or the feeder cassettes arranged in the at least one placement device. In other words, feeder cassettes are preferably delivered in the method according to the invention in such a way that the exchange feeder cassettes each have the same components as the originally empty feeder cassettes to be exchanged or as the not yet empty feeder cassettes to be exchanged. Delivery advantageously comprises the arrangement of the exchange feeder cassettes in a delivery device, for example in the direct vicinity of the at least one placement device. The delivery takes place in and/or before the at least one optional exchange period, so that an exchange of the feeder cassette is made possible in the at least one optional exchange period. In the case of two feeder cassettes to be exchanged with a determined time conflict, one of the feeder cassettes is exchanged within the mandatory exchange period and the other feeder cassette is exchanged earlier in the optional exchange period, and thus the time conflict between the two feeder cassettes to be exchanged is resolved.

The method according to the invention is particularly advantageous since the method steps described are carried out by the delivery system itself. This advantageously enables comparison, definition and delivery by the delivery system on site at the placement device. The delivery system and the devices of the delivery system are described in more detail in the second aspect of the invention. The method steps according to the invention preferably do not take place in an earlier planning of a production process of the placement device, but as a dynamic method by the delivery system according to the invention, which can preferably react to situations occurring during operation of the placement device using additional sensor devices.

A method designed in this way is particularly advantageous since it is made particularly easy to deliver components, and delays in the operation of the at least one placement device are advantageously avoided or at least reduced by the delivery of the feeder cassettes.

According to a preferred further development of the invention, it can be provided in a method for delivering feeder cassettes that the method further comprises:

Exchange of a feeder cassette from the at least one placement device with a delivered feeder cassette within the respective mandatory exchange periods and/or optional exchange periods by the delivery system.

The exchange of an empty feeder cassette within a mandatory exchange period and/or a feeder cassette that is not yet empty within an optional exchange period for one of the exchange feeder cassettes delivered represents an advantageous further development of the method according to the invention. As described above, feeder cassettes are preferably exchanged in the method according to the invention in such a way that the exchange feeder cassettes each have the same components as the originally empty feeder cassettes to be exchanged or as the not yet empty feeder cassettes to be exchanged. A method designed in this way is particularly advantageous since it is made particularly easy to deliver components, and delays in the operation of the at least one placement device are advantageously avoided or at least reduced by the delivery of the feeder cassettes. Clearly reduced to just one feeder cassette, the delivery process step always takes place before the exchange process step. The delivery preferably takes place at the exact time or with a time buffer for the planned exchange. For example, an above-described delivery device comprises a certain number of slots for delivering feeder cassettes, the time buffer being selected by the delivery system depending on free slots in the delivery device. In this case, it is advantageously possible for a feeder cassette to be delivered with a buffer that is longer in time if sufficient free slots are available in the delivery device and the delivery system has sufficient time to deliver this feeder cassette.

According to a preferred further development of the invention, it can be provided in a method for delivering feeder cassettes that the method further comprises:

Delivery of a feeder cassette exchanged within an optional exchange period to a processing device of the delivery system by the delivery system and/or Delivery of a feeder cassette exchanged within a mandatory exchange period to a replenishment device of the delivery system by the delivery system.

The feeder cassettes that have been exchanged within an optional exchange period still have components on, for example, the component spool. It is an advantageous further development of the method if these feeder cassettes are delivered to a processing device for processing the remaining components from the feeder cassette. A processing device enables mechanical and/or manual processing of the remaining components from the feeder cassette. The processing device preferably enables the remaining components to be removed from the feeder cassette, the removed components to be fed into a new feeder cassette and/or the removed components to be fed to a preparation device and/or a refilling device. The processing device thus advantageously enables the remaining components of a feeder cassette to be consumed or used and no components to be disposed of unused. The processing device preferably comprises a device for opening and/or closing the feeder cassette in order to enable the remaining components to be removed. In addition or as an alternative, it is advantageous if empty feeder cassettes that have been exchanged within a mandatory exchange period are delivered to a refilling device so that these feeder cassettes are refilled. The refilling device enables these feeder cassettes to be refilled mechanically and/or manually. Within the scope of the invention, the refilling device is to be understood as a device which is designed to refill a feeder cassette with remaining components with additional new components. The refilling device advantageously enables new components to be fed into the at least partially filled feeder cassette. The refilling device preferably has an interface for at least partially filled feeder cassettes and at least one interface for supplying components. The refilling device preferably guides the new components from the interface for supplying components into the at least partially filled feeder cassette. In contrast to the preparation device, the processing device and the refilling device are to be understood as devices for handling at least partially filled feeder cassettes. The preparation device preferably handles empty and/or new feeder cassettes. A method designed in this way is particularly advantageous since the remaining components are recycled and/or the feeder cassettes are reused, thus advantageously saving costs and material.

According to a preferred further development of the invention, it can be provided in a method for delivering feeder cassettes that the method further comprises:

Coordination of the exchange of a feeder cassette between the delivery system and the placement device by the delivery system.

The exchange of a feeder cassette usually causes vibrations and/or movements of the placement device. These vibrations and/or movements can negatively affect the accuracy for placing the components by the placement device. It is therefore advantageous if the exchange is carried out in a coordinated manner in terms of time and between the delivery system and the placement device, so that the exchange takes place at a time when, for example, no component is being placed and/or picked up by the placement device. The delivery system and the placement device are preferably connected for data communication in order to enable the coordination according to the invention. For example, the delivery system sends an inquiry to the placement device as to whether an exchange may take place.

The placement device can confirm this request, reject it and/or confirm it with a time delay. The delivery system can wait for a confirmation from the placement device and/or carry out another method step without confirmation if a specified time value is exceeded. The method according to the invention thus advantageously prevents a negative influence on the accuracy of the placement of the components by the placement device, or at least the influence of the exchange is reduced.

According to a preferred further development of the invention, it can be provided in a method for delivering feeder cassettes that the method further comprises:

Prioritization of the delivery and/or the exchange of feeder cassettes according to at least one priority criterion by the delivery system.

Prioritizing the delivery and/or the exchange of feeder cassettes according to at least one priority criterion represents a particularly advantageous embodiment of the method according to the invention. For example, the delivery and/or exchange is prioritized in such a way that a remaining number of components in a feeder cassette is taken into account. As described above, when a feeder cassette is exchanged within an optional period of time, there are still components in the feeder cassette. It is therefore advantageous to consider the number and/or the value of the remaining components in the feeder cassette when selecting which feeder cassette is delivered and/or exchanged. In the case of a determined time conflict between the mandatory exchange periods of two feeder cassettes, the value of the respective components of the two feeder cassettes is compared by the delivery system. The optional exchange period is then prioritized for the feeder cassettes with the lower value components, so that a lower residual value of components remains in the feeder cassette that is already exchanged before the mandatory exchange period within the specified optional exchange period. Further priority criteria for the delivery and/or exchange of the feeder cassettes are, for example, the consumption rate of the respective component by the placement device, the time between two collection times of the respective component by the placement device and/or the size of the respective component. Alternatively or additionally, it is advantageously possible according to this further development of the method according to the invention that the optional period of time is defined with a time buffer and the delivery system itself decides, depending on the priority criterion, when the feeder cassette is provided within the optional period of time. A method designed in this way is particularly advantageous because it makes it particularly easy to deliver components, and delays in the operation of the at least one placement device due to the delivery of the feeder cassettes are advantageously avoided or at least reduced, with at least one priority criterion in the delivery and/or exchange being taken into account.

According to a preferred further development of the invention, it can be provided in a method for delivering feeder cassettes that the method further comprises:

Determination of a preparation period for each of the feeder cassettes by the delivery system, in particular a preparation of a feeder cassette being triggered by a preparation device of the delivery system in the respective preparation period.

The delivery system preferably enables data communication with the preparation device, wherein a preparation of a feeder cassette, for example, can be triggered by a preparation signal. The preparation of a feeder cassette is to be understood as mechanical and/or manual filling and/or preparation of the feeder cassette for the delivery of the feeder cassette. The preparation device is preferably to be understood as a device for preparing the feeder cassette. The preparation device preferably enables filling, preparation and/or a preparatory movement of the feeder cassette. The preparation device preferably comprises a filling device for filling the feeder cassette with components and/or with a component spool. The preparation device is preferably designed to open and/or close the feeder cassette. The preparation device preferably has at least one interface for supplying components, at least one interface for delivering feeder cassettes, in particular empty and/or unprepared feeder cassettes, and at least one interface for dispensing prepared feeder cassettes. A preparation is preferably coordinated by the delivery system in terms of time for the delivery and/or the exchange of the feeder cassette, so that a method designed in this way advantageously enables optimally timed operation of the placement device throughout the preparation period. The preparation period is preferably designed with exact timing or with a time buffer.

According to a preferred further development of the invention, in a method for delivering feeder cassettes, it can be provided that the comparison also comprises a comparison of the recorded mandatory exchange periods with the at least one fixed optional exchange period, wherein time conflicts between the recorded mandatory exchange periods and the at least one specified optional exchange period are determined by the delivery system during the comparison. It represents an advantageous embodiment of the method according to the invention when the comparison is carried out iteratively. It is thus advantageous if not only the mandatory exchange periods are compared with one another, but also the mandatory exchange periods with the at least one defined optional exchange period. Furthermore, it is advantageous if at least two optional exchange periods are compared with one another in order to avoid time conflicts between the exchange periods.

According to a preferred further development of the invention, in a method for delivering feeder cassettes, it can be provided that the comparison and/or the determination take place iteratively, in particular wherein the specified optional exchange periods are shifted in time and/or shortened in time until no time conflicts between the detected mandatory exchange periods and/or the specified optional exchange periods are determined. In order to resolve the time conflicts between at least two of the optional and/or mandatory exchange periods, the at least one optional exchange period can be shifted forward and/or shortened, for example. A shortening of the optional exchange period is of course only possible to a limited extent and depends on an initial time buffer of the optional exchange period in order to fully enable delivery and/or an exchange within the optional exchange period.

According to a second aspect of the invention, the object is achieved by a delivery system for delivering components in feeder cassettes to at least one placement device. The delivery system is designed to carry out the method according to the first aspect. All the advantages that have already been described for the method according to the first aspect of the invention result from the described delivery system. The delivery system preferably has movement devices. For example, the movement devices are designed as rail-guided movement devices. For example, the moving devices comprise gripping devices for interacting with, picking up and/or releasing the feeder cassettes. Within the scope of the invention, the delivery system enables the feeder cassettes to be picked up, for example from a storage position and/or a preparation device, and subsequently a delivery of the feeder cassettes for the at least one placement device. The devices of the delivery system preferably have communication devices, the communication devices enabling data communication between the devices. The delivery system preferably comprises different and/or separate movement devices for delivering and exchanging the feeder cassettes. By way of example, the movement devices are designed as moving robot devices with gripper arms for delivering and/or exchanging the feeder cassettes. The delivery system preferably has a computer unit for carrying out the method steps at least in sections. The computer unit is preferably integrated in at least one of the movement devices and/or configured separately. The computer unit is preferably designed to control and/or regulate the movement devices of the delivery system. Furthermore, the computer unit is preferably designed to record a utilization of the delivery system, for example in order to define the at least one optional exchange period depending on the utilization of the delivery system. A delivery system configured in this way is particularly advantageous since the delivery system enables the smoothest possible delivery of components in feeder cassettes to the at least one placement device. The delivery system according to the invention is preferably designed to supply a large number of placement devices. The delivery system according to the invention advantageously avoids or at least reduces the waiting time of a placement device for a delivery process and/or an exchange of a feeder cassette.

According to a third aspect of the invention, the object is achieved by a computer program product for delivering components in feeder cassettes to at least one placement device through the delivery system. The computer program product comprises commands which cause the delivery system according to the second aspect to carry out the method steps according to the first aspect. All the advantages that have already been described for the method according to the first aspect of the invention and for the delivery system according to the second aspect of the invention result from the described computer program product.

According to a fourth aspect of the invention, the object is achieved by a computer-readable medium on which the computer program product according to the third aspect is stored. All the advantages that have already been described for the method according to the first aspect of the invention result from the described delivery system.

A method according to the invention, a delivery system, a computer program product and a computer-readable medium are explained in more detail below with reference to drawings. Brief description of the schematic drawings:

BRIEF DESCRIPTION OF THE DRAWING(S)

Figure 2:
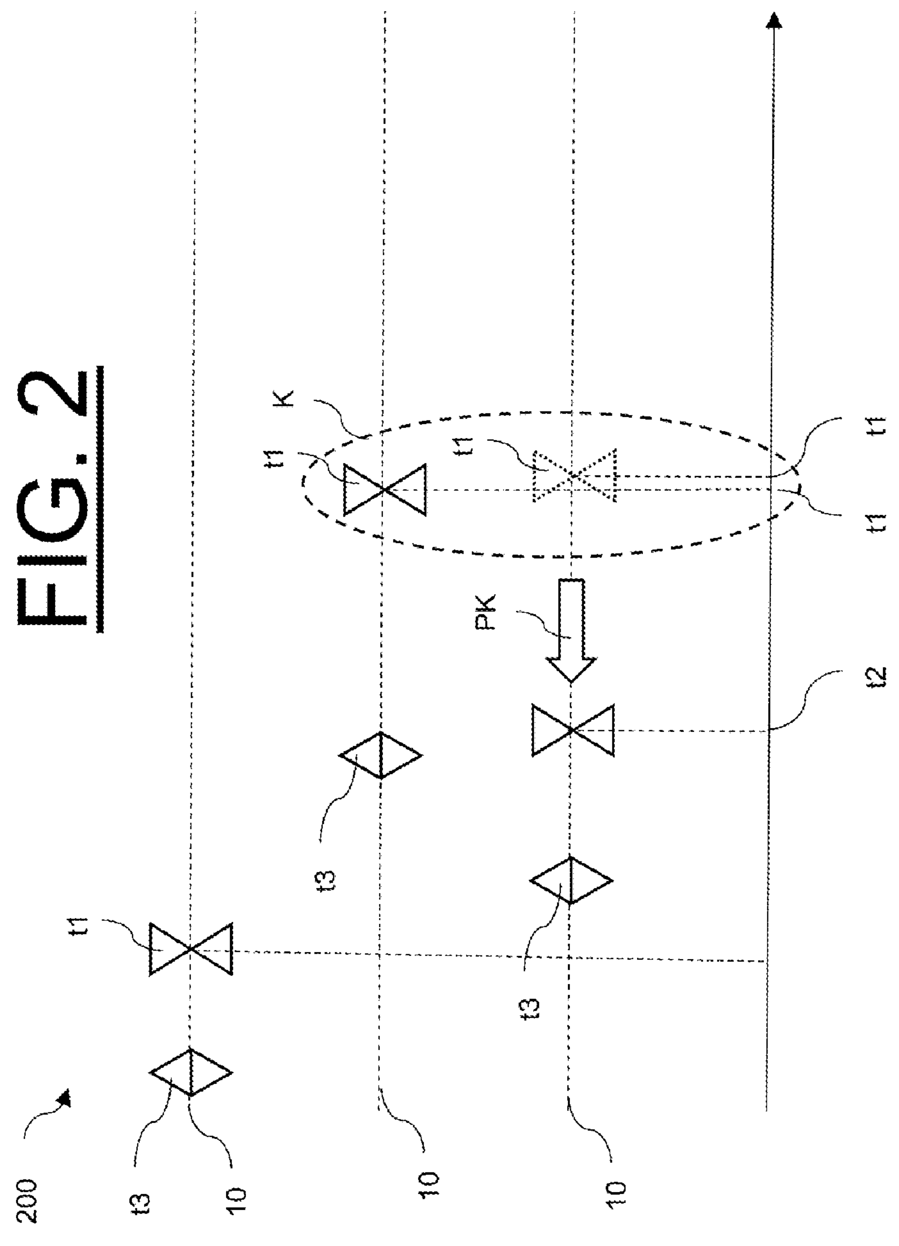
Figure 3:
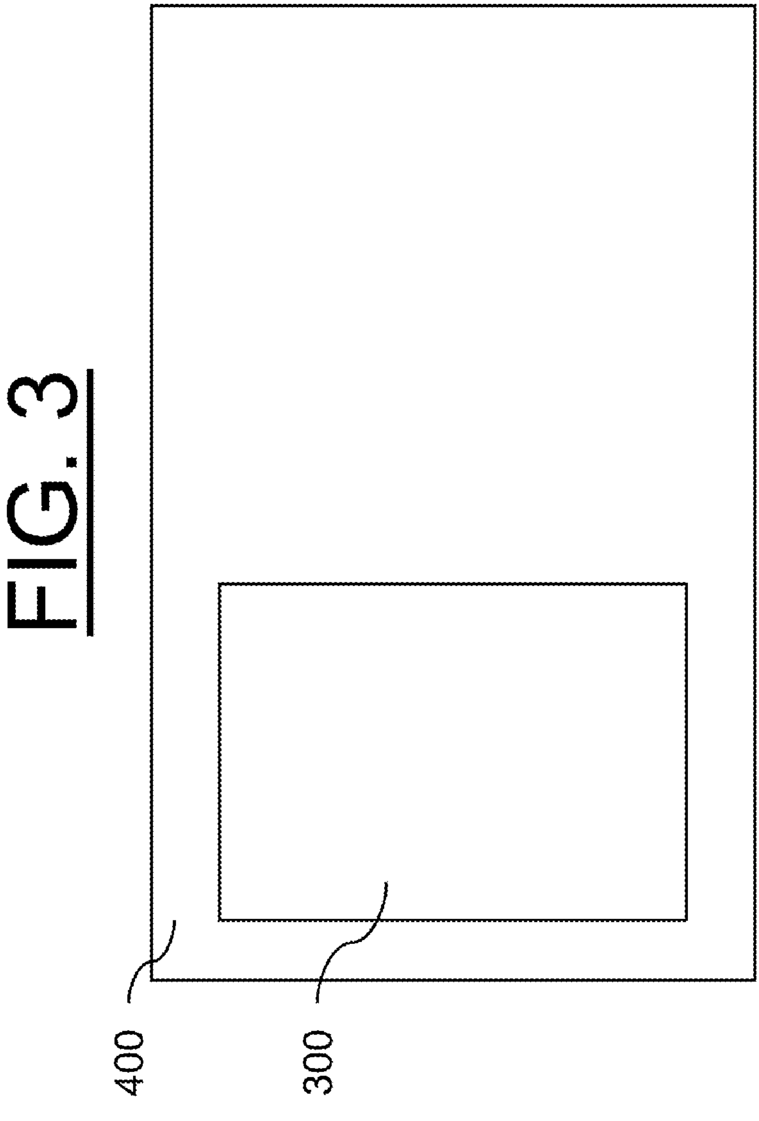
Figure 4:
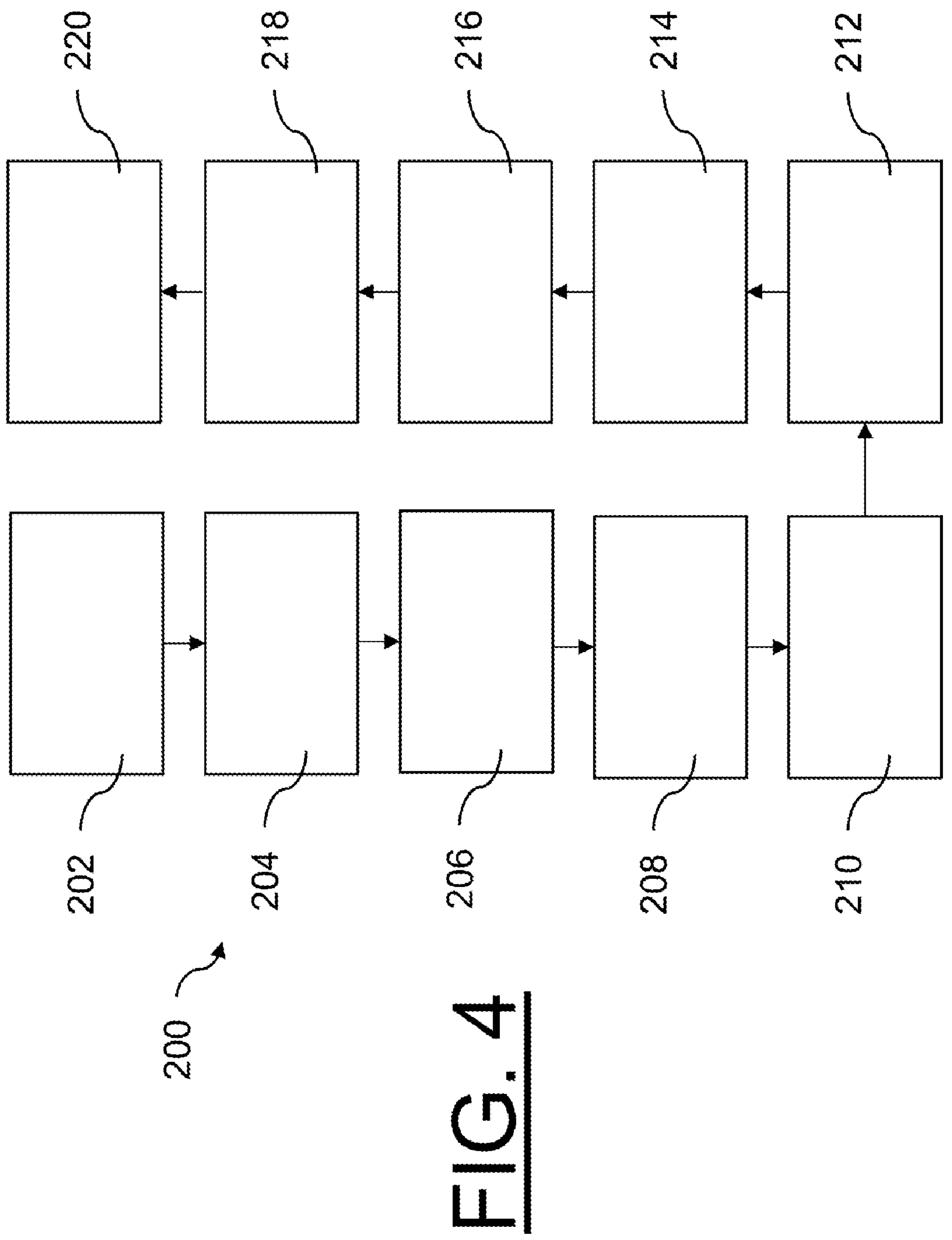

FIG. 1 shows a plan view of a delivery system with a preparation device, a processing device and a refilling device, as well as a placement device, FIG. 2 shows the exchange periods of three feeder cassettes in a time course diagram, FIG. 3 shows a computer program product and a computer-readable medium in a plan view, and FIG. 4 shows a method according to the invention in a flowchart.

Elements with the same function and mode of operation are each provided with the same reference signs in FIGS. 1 to 4.

FIG. 1 shows a delivery system 100 with a preparation device 102, a processing device 104 and a refilling device 106, as well as a placement device 150, in a schematic plan view. The task of the method 200 according to the invention (not shown) and the delivery system 100 is the delivery of components 12 in feeder cassettes 10 to a placement device 150 by the delivery system 100. For this purpose, the delivery system 100 first records a mandatory exchange period t1 (not shown) for each of the feeder cassettes 10 by the delivery system 100. For a better overview, the placement device 150 is only shown with two feeder cassettes 10. Furthermore, the recorded mandatory exchange periods t1 (not shown) are compared with one another, wherein time conflicts K (not shown) between the recorded mandatory exchange periods t1 (not shown) are determined by the delivery system 100 during the comparison. An optional exchange period t2 (not shown) is then specified by the delivery system 100 for one of the feeder cassettes 10 associated with the determined time conflict K (not shown). Finally, components 12 in feeder cassettes 10 are delivered to the at least one placement device 150 within the optional exchange period t2 (not shown) by the delivery system 100. Furthermore, an exchange 210 of the feeder cassette 10 from the placement device 150 with delivered feeder cassettes 10 takes place within the respective mandatory exchange periods t1 (not shown) and in the respective optional exchange periods t2 (not shown) by the delivery system 100. The feeder cassette 10 exchanged in the optional exchange period t2 (not shown) is delivered to a processing device 104 of the delivery system 100 by the delivery system 100. The feeder cassette 10 exchanged in the mandatory exchange period t1 (not shown) is delivered to a refilling device 106 of the delivery system 100 by the delivery system 100.

FIG. 2 shows the exchange periods t1, t2 of three feeder cassettes 10 schematically in a time course diagram. A time conflict K has been determined between the mandatory exchange periods t1 of the middle and lower feeder cassettes 10. The mandatory exchange periods t1 of the middle and lower feeder cassettes 10 are too close together in terms of time and both feeder cassettes 10 would not be delivered and exchanged in the respective mandatory exchange period t1 in good time. Consequently, there would be delays in the operation of the placement device 150 (not shown), since a component 12 (not shown) could not be picked up in time from a feeder cassette 10 (not shown). The method 200 according to the invention (not shown) and the delivery system 100 (not shown) make it possible to define an optional exchange period t2. In FIG. 2, an optional exchange period t2 is defined for the lower feeder cassette 10. The determination, delivery and exchange of the lower feeder cassette 10 is prioritized according to a priority criterion PK by the delivery system 100 (not shown). The time conflict K between the mandatory exchange periods t1 of the middle and lower feeder cassettes 10 is consequently resolved. Furthermore, a preparation period t3 is defined for each of the feeder cassettes 10 by the delivery system 100 (not shown), with a preparation of a feeder cassette 10 being triggered by a preparation device 102 (not shown) of the delivery system 100 (not shown) in the respective preparation period t3.

A computer program product and a computer-readable medium are shown schematically in a plan view in FIG. 3.

FIG. 4 shows a configuration of the method 200 according to the invention schematically in a flowchart. For improved clarity, only the reference numbers of the method steps are indicated in FIG. 4. In a first method step, the determination method 200 comprises the detection 202 of a mandatory exchange period t1 for each of the feeder cassettes 10 by the delivery system 100. In a further method step, the determination method 200 comprises the comparison 204 of the recorded mandatory exchange periods t1, wherein time conflicts K between the recorded mandatory exchange periods t1 are determined by the delivery system 100 during the comparison 204. In a further method step, the determination method 200 comprises the specification 206 of an optional exchange period t2 for at least one of the feeder cassettes 10 with a determined time conflict K by the delivery system 100. In a further method step, the determination method 200 comprises the delivery 208 of components 12 in feeder cassettes 10 to the at least one placement device 150 in the at least one optional exchange period t2 by the delivery system 100. In a further method step, the determination method 200 comprises the exchange 210 of a feeder cassette 10 from the at least one placement device 150 with a delivered feeder cassette 10 in the respective mandatory exchange periods t1 and/or optional exchange periods t2 by the delivery system 100. In a further method step, the determination method 200 comprises the prioritization 212 of the delivery 208 and/or the exchange 210 of feeder cassettes 10 according to at least one priority criterion PK by the delivery system 100. In a further method step, the determination method 200 includes the determination 214 of a preparation period t3 for each of the feeder cassettes 10 by the delivery system 100, in particular with a preparation of a feeder cassette 10 being triggered by a preparation device 102 of the delivery system 100 in the respective preparation period t3. In a further method step, the determination method 200 comprises the delivery 216 of a feeder cassette 10 exchanged in an optional exchange period t2 to a processing device 104 of the delivery system 100 by the delivery system 100. In a further method step, the determination method 200 includes the delivery 218 of a feeder cassette 10 exchanged in a mandatory exchange period t1 to a refilling device 106 of the delivery system 100 by the delivery system 100. In a further method step, the determination method 200 comprises the coordination 220 of the exchange 210 of a feeder cassette between the delivery system 100 and the placement device 150 by the delivery system 100.

REFERENCE SIGN LIST

10 Feeder cassette
12 Components

100 Delivery system
102 Preparation device
104 Processing device
106 Refilling device
150 Placement device
200 Method
202 Detection
204 Comparison
206 Determination
208 Delivery
210 Exchange
212 Prioritization
214 Determination
216 Delivery
218 Delivery
220 Coordination
300 Computer program product
400 Computer-readable medium
t1 Mandatory exchange period
t2 Optional exchange period
t3 Preparation period
K Time conflict
PK Priority criterion

The invention claimed is:

1. Method for delivering components in feeder cassettes to at least one placement device by a delivery system, the method having the following method steps:

detection of a mandatory exchange period (t1) for each of the feeder cassettes by the delivery system, comparison of the detected mandatory exchange periods (t1), wherein time conflicts (K) between the detected mandatory exchange periods (t1) of the respective feeder cassettes are determined by the delivery system during the comparison, determination of an optional exchange period (t2) for at least one of the feeder cassettes with a determined time conflict (K) by the delivery system, delivery of components in feeder cassettes to the at least one placement device within the at least one optional exchange period (t2) by the delivery system.

2. Method for delivering feeder cassettes according to claim 1, wherein the method further comprises:

exchange of a feeder cassette from the at least one placement device with a delivered feeder cassette in the respective mandatory exchange periods (t1) and/or optional exchange periods (t2) by the delivery system.

3. Method for delivering feeder cassettes according to claim 2, wherein the method further comprises:

delivery of a feeder cassette exchanged in the optional exchange period (t2) to a processing device of the delivery system by the delivery system and/or delivery of the feeder cassette that has been exchanged in the mandatory exchange period (t1) to a refilling device of the delivery system by the delivery system.

4. Method for delivering feeder cassettes according to claim 2, wherein the method further comprises:

coordination of the exchange of the feeder cassette between the delivery system and the placement device by the delivery system.

5. Method for delivering feeder cassettes according to claim 1, wherein the method further comprises:

prioritization of the delivery and/or the exchange of feeder cassettes according to at least one priority criterion (PC) by the delivery system.

6. Method for delivering feeder cassettes according to claim 1, wherein the method further comprises:

determination of a preparation period (t3) for each of the feeder cassettes by the delivery system, wherein in particular a preparation of each of the feeder cassettes is triggered by a preparation device of the delivery system within the respective preparation period (t3).

7. Method for delivering feeder cassettes according to claim 1, wherein the comparison further comprises a comparison of the recorded mandatory exchange periods (t1) with the at least one fixed optional exchange period (t2), wherein time conflicts (K) between the recorded mandatory exchange periods (t1) and the at least one specified optional exchange period (t2) are determined by the delivery system during the comparison.

8. Method for delivering feeder cassettes according to claim 1, wherein the comparison and/or the determination take place iteratively, wherein in particular the specified optional exchange periods (t2) are shifted in time and/or shortened in time until time conflicts (K) between the recorded mandatory exchange periods (t1) and/or the fixed optional exchange periods (t2) can no longer be determined.

9. Delivery system for delivering components in feeder cassettes to at least one placement device, wherein the delivery system is designed to carry out the method according to claim 1.

10. Computer program product for delivering components in feeder cassettes to at least one placement device by the delivery system, wherein the computer program product comprises commands which cause a delivery system to carry out the method steps according to claim 1.

11. Computer-readable medium on which the computer program product according to claim 10 is stored.

* * * * *